(12) United States Patent
Shim et al.

(10) Patent No.: US 11,060,167 B2
(45) Date of Patent: Jul. 13, 2021

(54) LAYERED FEAS, METHOD OF PREPARING SAME, AND FEAS NANOSHEET EXFOLIATED FROM SAME

(71) Applicants: INDUSTRY-ACADEMIC COOPERATION FOUNDATION, YONSEI UNIVERSITY, Seoul (KR); KOREA INSTITUTE OF SCIENCE AND TECHNOLOGY, Seoul (KR)

(72) Inventors: Woo Young Shim, Seoul (KR); Dong Won Chun, Seoul (KR); Hyesoo Kim, Seoul (KR); Jong Bum Won, Seoul (KR)

(73) Assignees: INDUSTRY-ACADEMIC COOPERATION FOUNDATION, YONSEI UNIVERSITY, Seoul (KR); KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/415,751

(22) Filed: May 17, 2019

(65) Prior Publication Data

US 2019/0352744 A1 Nov. 21, 2019

(30) Foreign Application Priority Data

May 18, 2018 (KR) ........................ 10-2018-0057450

(51) Int. Cl.
*C22C 1/04* (2006.01)

(52) U.S. Cl.
CPC ............ *C22C 1/04* (2013.01); *C22C 2200/04* (2013.01)

(58) Field of Classification Search
CPC .............................. C22C 1/04; C22C 2200/04
USPC ......................................................... 148/513
See application file for complete search history.

(56) References Cited

FOREIGN PATENT DOCUMENTS

KR 10-2008-0045627 5/2008
KR 10-2010-0138036 12/2010

OTHER PUBLICATIONS

Chu et al., "The synthesis and characterization of LiFeAs and NaFeAs", *Physica C*, 2009, 469 326-331.
Li et al., "The stable structures of iron pnictides AFeAs (A=alkali and alkaline-earth metals): A first principles study", *Solid State Communications*, 2011, 151 (6) 446-450.
Office Action issued in Korean Patent Application No. 10-2018-0057450, dated May 20, 2019.

*Primary Examiner* — Weiping Zhu
(74) *Attorney, Agent, or Firm* — Norton Rose Fulbright US LLP

(57) ABSTRACT

The present invention relates to: layered iron arsenide (FeAs), which is more particularly layered FeAs, which, unlike the conventional bulk FeAs, has a two-dimensional (2D) crystal structure, has the ability to be easily exfoliated into nanosheets, and has superconductivity; a method of preparing the same; and a FeAs nanosheet exfoliated from the same.

6 Claims, 11 Drawing Sheets

Preparation Example 1 (LiFeAs)  remove Li → Example 1 (Layered FeAs)  exfoliate → Example 5 (FeAs nanosheet)

Preparation Example 2 (CaFe$_2$As$_2$)  remove Ca → Example 2 (Layered FeAs)  exfoliate → Example 6 (FeAs nanosheet)

Preparation Example 1 (LiFeAs)  | HAADF w/  | HAADF | ABF | ABF w/ atoms

Example 1 (Layered FeAs)  | HAADF w/  | HAADF | ABF | ABF w/ atoms

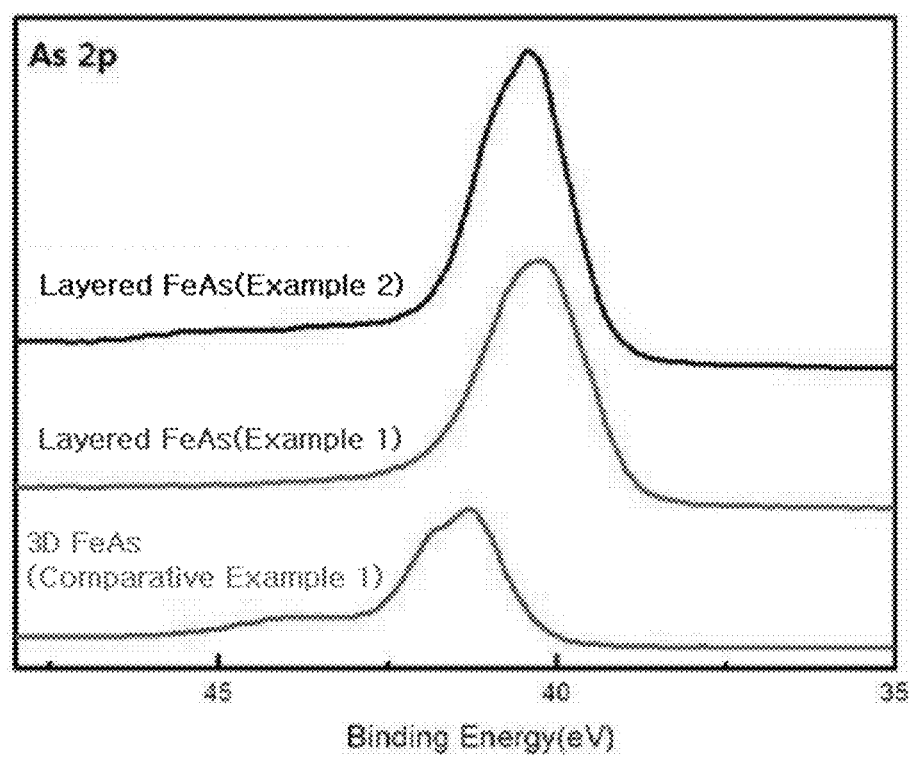
FIG. 7A
FIG. 7b
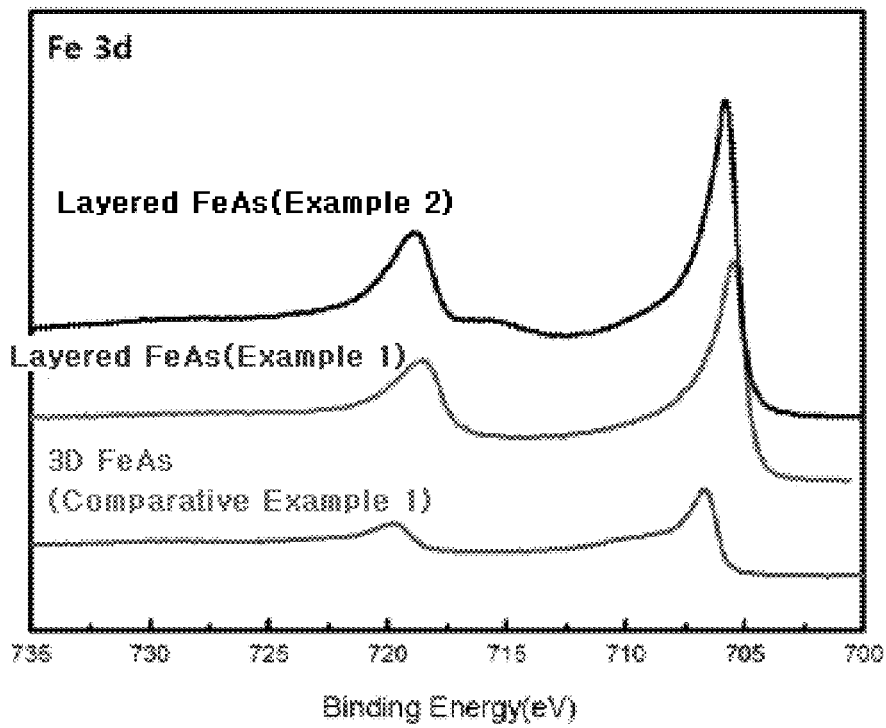
FIG. 7B

LAYERED FEAS, METHOD OF PREPARING SAME, AND FEAS NANOSHEET EXFOLIATED FROM SAME

STATEMENT OF GOVERNMENTAL SUPPORT

This invention was supported by the National Research Foundation (NRF) of Korea through grants funded by the Korean government (2018M3D1A1058793).

CROSS-REFERENCE TO RELATED APPLICATION

This application claims priority to and the benefit of Korean Patent Application No. 10-2018-0057450, filed on May 18, 2018, the disclosure of which is incorporated herein by reference in its entirety.

BACKGROUND

1. Field of the Invention

The present invention relates to: layered iron arsenide (FeAs), which is more particularly layered FeAs, which, unlike conventional bulk FeAs, has a two-dimensional (2D) crystal structure, has the ability to be easily exfoliated into nanosheets, and has superconductivity; a method of preparing the same; and a FeAs nanosheet exfoliated from the same.

2. Discussion of Related Art

Research on graphene and various other ultra-thin 2D materials based on the novel physical, chemical, mechanical, and optical properties of the materials has been actively conducted in various fields. These low-dimensional materials are expected to provide new breakthrough functions that existing bulk materials do not have, and are highly likely to be next-generation future materials that replace existing materials.

Research on existing 2D materials has been conducted based on the top-down method, in which weak interlayer Van der Waals bonds are broken by physical and chemical means, and the bottom-up method, in which a large-area thin film is grown based on vapor deposition. In particular, the top-down method always requires that the pristine form of a target subject to be exfoliated have a 2D layered crystal structure, and thus researchable subjects thereof are highly limited to graphene without band gap, layered metal oxides/nitrides with low charge mobility, transition metal chalcogen compounds with low electron mobility/low electrical conductivity, and the like.

Due to limitations of the existing research methods, research on 2D materials has been highly limited to materials such as graphene, transition metal chalcogen compounds, and the like. Such existing research methods have limitations in that the possibility of low-dimensional material development is limited, in essence, by the types of elements to be used, and the methods are not suitable for use in the development of low-dimensional future materials out of the myriad of three-dimensional (3D) bulk-type materials not having a layered structure.

Meanwhile, FeAs has been used as a superconductor, the aimed applications of which include applications to memory devices, microwave communication equipment used in satellite communications and medical precision diagnostic equipment using superconducting quantum interference devices (SQUIDs) detecting micromagnetic fields, Josephson devices, cables, current limiters, power devices such as magnetic switches, and the like.

SUMMARY OF THE INVENTION

The present invention is directed to providing: layered FeAs, which, unlike conventional bulk FeAs, has a 2D crystal structure, has the ability to be easily exfoliated into nanosheets, and has superconductivity; a method of preparing the same; and a FeAs nanosheet exfoliated from the same.

One aspect of the present invention provides a method of preparing layered FeAs, the method including the steps of: (1) heat-treating a mixture including Li or Ca powder, Fe powder, and As powder and cooling the same, thereby obtaining a layered compound that has a tetragonal crystal structure with the P4/nmm space group and is represented by the chemical formula LiFeAs or has a tetragonal crystal structure with the I4/mmm space group and is represented by the chemical formula $CaFe_2As_2$; and (2) selectively removing the Li ions or Ca ions contained in the layered compound without disrupting the crystal structure of the layered compound, thereby obtaining layered FeAs.

According to one exemplary embodiment of the present invention, the Li ions contained in the layered compound may be removed by the treatment of the layered compound with a solvent including at least one selected among water, ethanol, and isopropanol.

According to one exemplary embodiment of the present invention, the Ca ions contained in the layered compound may be removed by the treatment of the layered compound with a mixed solution containing a salt represented by the following Chemical Formula 1 and a solvent capable of dissolving the salt.

$$MX_a (1 \leq a \leq 3) \qquad \text{<Chemical Formula 1>}$$

In Chemical Formula 1, M is any one selected between Fe and Al, and X is any one selected among Cl, F, and I.

According to one exemplary embodiment of the present invention, the mixture may include Li powder, Fe powder, and As powder, and the heat treatment of Step (1) may be performed at 650 to 800° C. for 3 to 7 days.

According to one exemplary embodiment of the present invention, the mixture may include Ca powder, Fe powder, and As powder, and the heat treatment of Step (1) may be performed at 1000 to 1100° C. for 6 to 24 hours.

According to one exemplary embodiment of the present invention, the cooling of Step (1) may be performed at a cooling rate of 0.5 to 3° C./hour.

Another aspect of the present invention provides layered FeAs having a tetragonal crystal structure with the P4/nmm space group or the I4/mmm space group.

According to one exemplary embodiment of the present invention, the layered FeAs having a tetragonal crystal structure with the P4/nmm space group may produce a peak at 2θ of 14.0±0.2 and not produce a peak at 2θ of 30.8±0.2, 34.2±0.2, 35.1±0.2, 36.5±0.2, 43.2±0.2, 44.0±0.2, 45.2±0.2, 45.9±0.2, 48.6±0.2, 53.2±0.2, 53.5±0.2, 55.4±0.2, 57.4±0.2, 59.9±0.2, 60.6±0.2, 64.5±0.2, 66.8±0.2, 74.2±0.2, 76.2±0.2, and 76.8±0.2 in an X-ray diffraction pattern obtained by a powder X-ray diffraction method using Cu-Kα radiation.

According to one exemplary embodiment of the present invention, the layered FeAs having a tetragonal crystal structure with the I4/mmm space group may produce peaks at 2θ of 15.0±0.2, 32.3±0.2, 35.9±0.2, 45.0±0.2, 46.6±0.2, 57.8±0.2, 60.0±0.2, and 63.1±0.2 and not produce a peak at 2θ of 30.8±0.2, 34.2±0.2, 35.1±0.2, 36.5±0.2, 43.2±0.2, 44.0±0.2, 45.2±0.2, 45.9±0.2, 48.6±0.2, 53.2±0.2, 53.5±0.2, 55.4±0.2, 57.4±0.2, 59.9±0.2, 60.6±0.2, 64.5±0.2, 66.8±0.2, 74.2±0.2, 76.2±0.2, and 76.8±0.2.

Still another aspect of the present invention provides a FeAs nanosheet exfoliated from the layered FeAs of the present invention and having a tetragonal crystal structure with the P4/nmm space group or the I4/mmm space group.

According to one exemplary embodiment of the present invention, the FeAs nanosheet may have a thickness of 60 nm or less.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 7A is a graph illustrating X-ray photoelectron spectroscopy (XPS) results of the 3D FeAs of Comparative Example 1 and the layered FeAs of Examples 1 and 2, which is shown for As 2p; FIG. 7B is a graph illustrating XPS results of the 3D FeAs of Comparative Example 1 and the layered FeAs of Examples 1 and 2, which is shown for Fe 3d.

DETAILED DESCRIPTION OF EXEMPLARY EMBODIMENTS

Hereinafter, embodiments of the present invention will be described in detail with reference to the accompanying drawings so that those skilled in the art can easily carry out the present invention. The present invention may be embodied in many different forms and is not limited to the embodiments described herein.

Hereinafter, the method of preparing layered FeAs according to the present invention will be described.

The method of preparing layered FeAs according to the present invention can be used to prepare a 2D structure from the conventional 3D-structured bulk FeAs, and the prepared layered FeAs may be easily exfoliated into single sheets and have superconductivity, unlike conventional bulk FeAs.

First, in Step (1), a mixture including Li or Ca powder, Fe powder, and As powder is heat-treated and then cooled, and thereby a layered compound is obtained.

The mixture may be sealed in a reaction vessel and then heat-treated, and the inside of the reaction vessel may be maintained in an inert gas atmosphere or a vacuum atmosphere.

The material of the reaction vessel may be, for example, alumina, molybdenum, tungsten, or quartz, but any material may be used as long as it does not react with the sample and is not damaged at high temperatures.

Figure 2A:
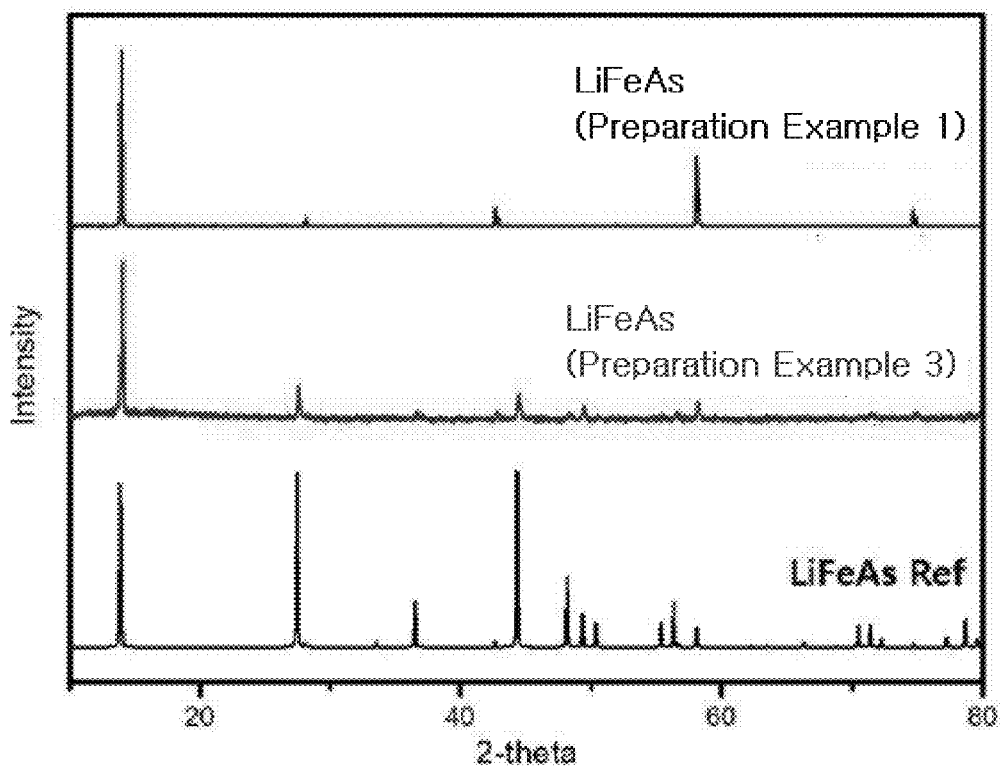
FIG. 2A is a graph illustrating X-ray diffraction (XRD) analysis results of LiFeAs and the layered LiFeAs of Preparation Examples 1 and 3.
Figure 2B:
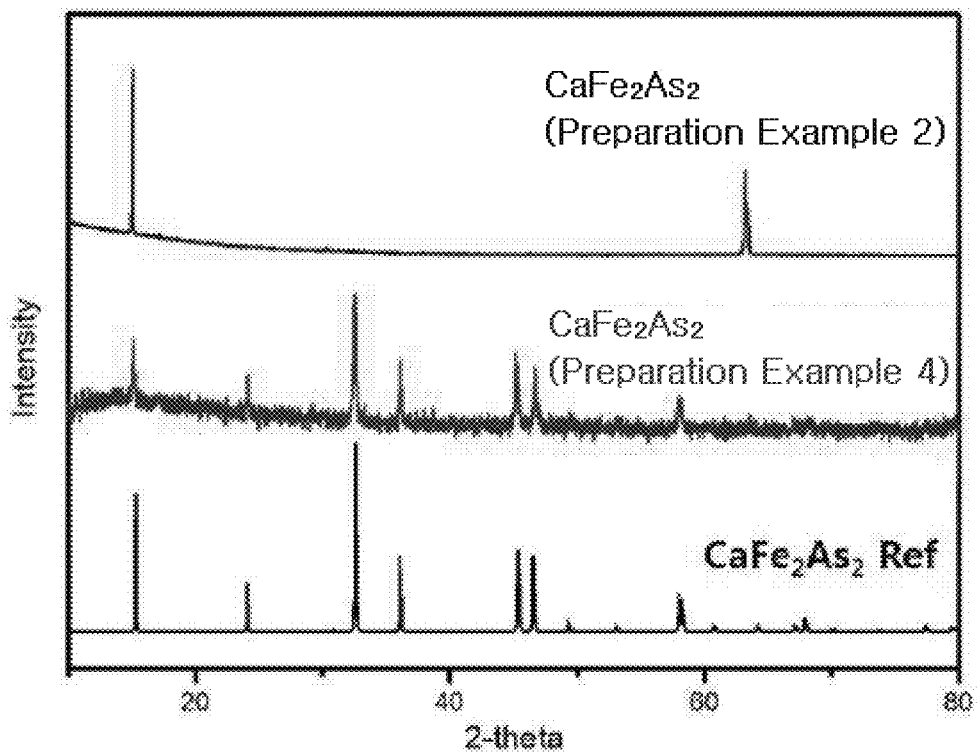
FIG. 2B is a graph illustrating XRD analysis results of $CaFe_2As_2$ and the layered $CaFe_2As_2$ of Preparation Examples 2 and 4.
Figure 2C:
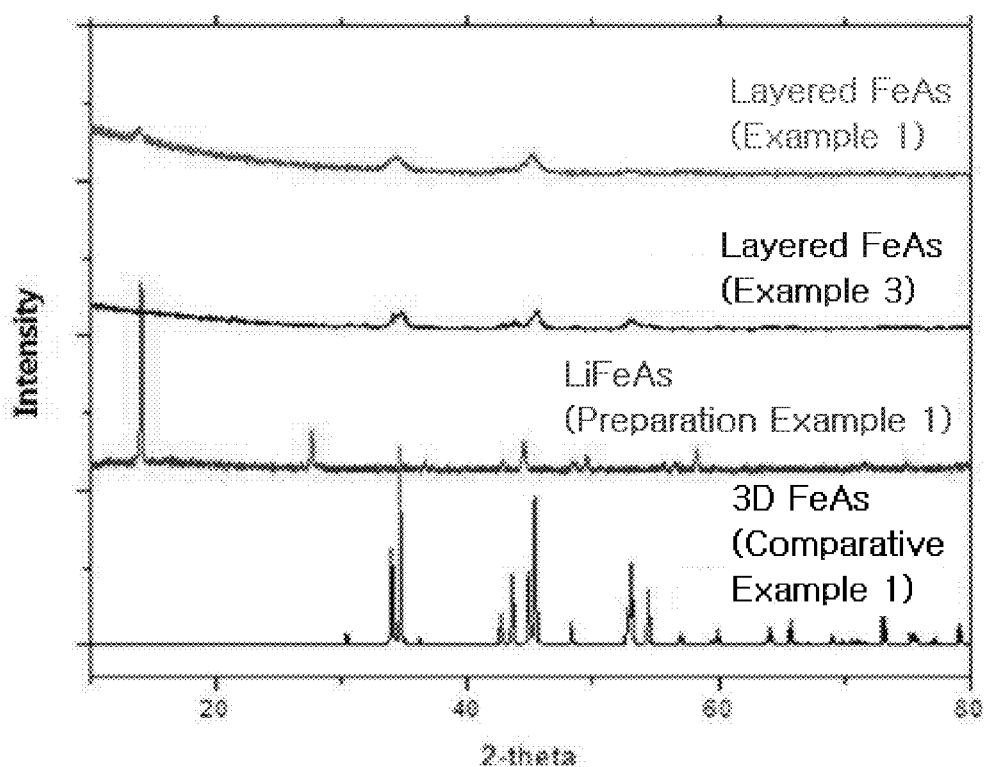
FIG. 2C is a graph illustrating XRD analysis results of the conventional 3D bulk FeAs, the layered LiFeAs of Preparation Example 1, and the layered FeAs of Example 1.

When the above-described mixture includes Li powder, Fe powder, and As powder, the layered compound is LiFeAs and has a tetragonal crystal structure with the P4/nmm space group, as can be confirmed by the XRD result of LiFeAs illustrated in FIG. 2C. On the other hand, when the above-described mixture includes Ca powder, Fe powder, and As powder, the layered compound is $CaFe_2As_2$ and has a tetragonal crystal structure with the I4/mmm space group, as can be confirmed by the XRD result of $CaFe_2As_2$ illustrated in FIG. 2D.

Figure 1:
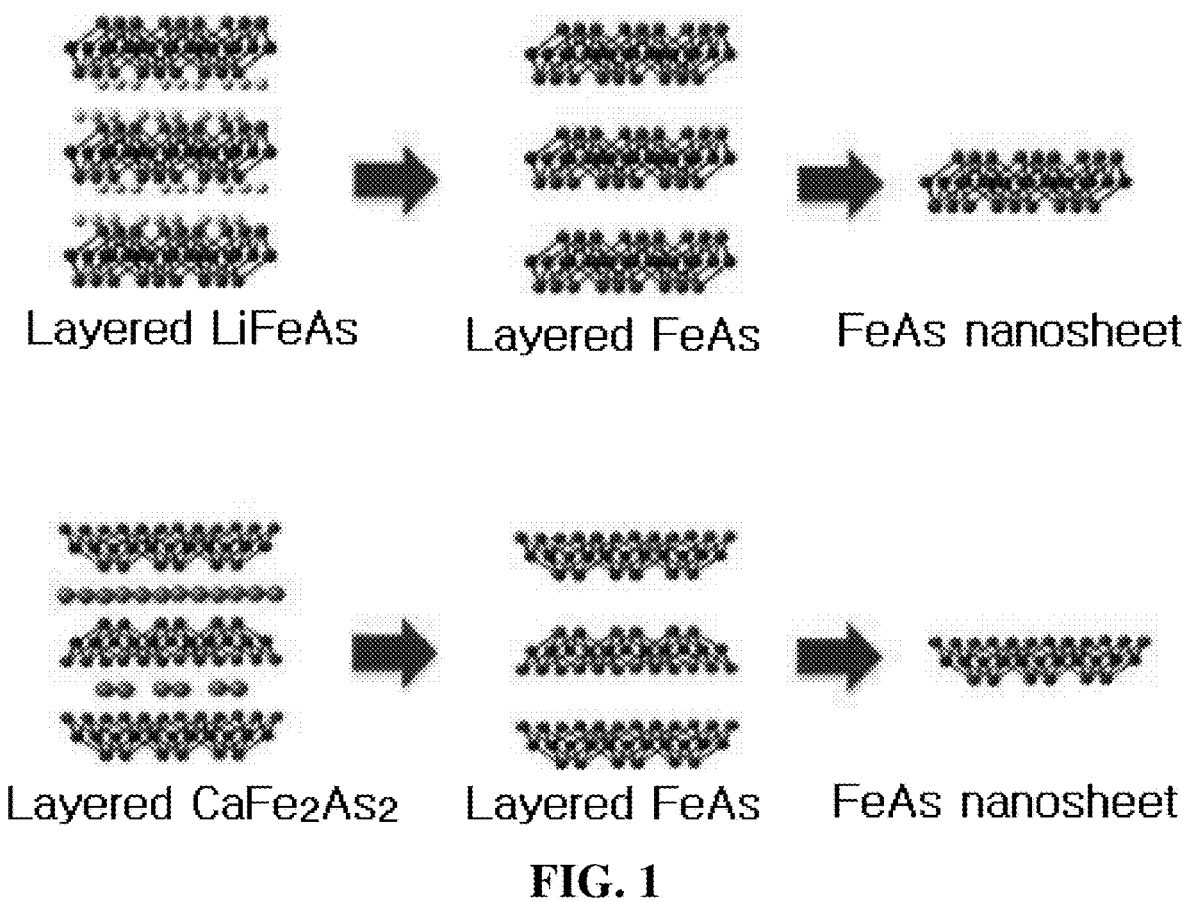
FIG. 1 is a schematic view illustrating a method of preparing layered FeAs according to one exemplary embodiment of the present invention.

FIG. 1 illustrates that the LiFeAs or $CaFe_2As_2$ prepared through Step (1) has a 2D structure, unlike the FeAs having a 3D crystal structure, and that the selective removal of Li ions from the LiFeAs or of Ca ions from the $CaFe_2As_2$ in Step (2) to be described below results in the preparation of layered FeAs without causing the disruption of the crystal structure of the LiFeAs or the $CaFe_2As_2$.

According to one exemplary embodiment of the present invention, when the mixture includes Li powder, Fe powder, and As powder, the above-described heat treatment may be performed at 650 to 800° C. for 3 to 7 days.

When the heat treatment is carried out at a temperature of less than 650° C., some raw materials may remain unreacted because the sintering reaction of the mixture is not completed, and this may lead to problems such as the reduction in the yield of the layered LiFeAs being prepared and the like. On the other hand, the heat treatment carried out at a temperature of greater than 800° C. may cause the Li ions to be vaporized, and this may further lead to problems such as damage to the reaction vessel used in the sintering reaction, reduction in the yield of the layered LiFeAs being prepared, and the like.

When the heat treatment is carried out for less than three days, some raw materials may remain unreacted because the sintering reaction of the mixture is not completed, and this may lead to problems such as the reduction in the yield of the layered LiFeAs being prepared and the like. On the other hand, the heat treatment carried out for more than seven days may unnecessarily increase the production time.

The mixture of Step (1) may further include Sn powder. The additional use of the Sn powder may result in an increase in the size of single crystals of the layered compound being prepared, and in this case, the size of the layered-FeAs single crystal can be maintained even after the Li ions or Ca ions contained in the layered compound have been removed.

The process of cooling after heat treatment in Step (1) is necessary for the crystallization of LiFeAs, and the cooling rate may affect the size of a single crystal. According to one exemplary embodiment of the present invention, the cooling may be carried out at a cooling rate of 0.5 to 3° C./hour, whereby the heat-treated layered compound can develop a monocrystalline structure. The cooling performed at the above-described cooling rate may result in an increase in the size of single crystals of the layered compound and of the layered FeAs being prepared. As the size of single crystals of the layered FeAs is increased, the grain boundary of the particles is decreased, and accordingly, the charge mobility may be increased and the aspect ratio of the FeAs nanosheet obtained by the exfoliation of the layered FeAs may be increased.

When the cooling rate is less than 0.5° C./hour, the Li ions may vaporize, leading to a change in the composition of the material being prepared. On the other hand, when the cooling rate exceeds 3° C./hour, the LiFeAs being prepared may develop a polycrystalline structure.

According to one exemplary embodiment of the present invention, when the mixture includes Ca powder, Fe powder, and As powder, the above-described heat treatment may be performed at 1000 to 1100° C. for 6 to 24 hours.

When the heat treatment is carried out at a temperature of less than 1000° C., some raw materials may remain unreacted because the sintering reaction of the mixture is not completed, and this may lead to problems such as reduction in the yield of the layered $CaFe_2As_2$ being prepared and the like. On the other hand, the heat treatment carried out at a temperature of greater than 1100° C. may vaporize the Ca ions, and this may further lead to problems such as damage to the reaction vessel used in the sintering reaction, reduction in the yield of the layered $CaFe_2As_2$ being prepared, and the like.

When the heat treatment is carried out for less than six hours, some raw materials may remain unreacted because the sintering reaction of the mixture is not completed, and this may lead to problems such as reduction in the yield of the layered $CaFe_2As_2$ being prepared and the like. On the other hand, the heat treatment carried out for more than 24 hours may unnecessarily increase the production time.

The process of cooling after heat treatment is necessary for the crystallization of $CaFe_2As_2$, and the cooling rate may affect the size of a single crystal. According to one exemplary embodiment of the present invention, the above-described cooling may be carried out at a cooling rate of 0.5 to 3° C./hour, whereby the heat-treated layered compound can develop a monocrystalline structure. The cooling performed at the above-described cooling rate may result in an increase in the size of single crystals of the layered compound and of the layered FeAs being prepared. As the size of single crystals of the layered FeAs is increased, the grain boundary of the particles is decreased, and accordingly, the charge mobility may be increased and the aspect ratio of the FeAs nanosheet obtained by the exfoliation of the layered FeAs may be increased.

When the cooling rate is less than 0.5° C./hour, the Ca ions may vaporize, leading to a change in the composition of the material being prepared. On the other hand, when the cooling rate exceeds 3° C./hour, the $CaFe_2As_2$ being prepared may develop a polycrystalline structure.

Next, in Step (2), the Li ions or Ca ions contained in the layered compound prepared through Step (1) are selectively removed, and thereby layered FeAs is obtained.

When the layered compound is LiFeAs, the Li ions contained in the LiFeAs may be removed by the treatment of the layered compound with a solvent that includes at least one selected among water, ethanol, and isopropanol and preferably includes water.

When the layered compound is $CaFe_2As_2$, the Ca ions contained in the $CaFe_2As_2$ may be removed by the treatment of the layered compound with a mixed solution containing a salt represented by the following Chemical Formula 1 and a solvent capable of dissolving the salt.

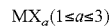   <Chemical Formula 1>

In Chemical Formula 1, M may be any one selected between Fe and Al, and X may be any one selected among Cl, F, and I.

The salt may include an anion (X) having high electronegativity and a cation (M) having an electronegativity value between an As ion and a Ca ion so that it can easily react with the Ca ion, that is, the alkaline earth metal ion contained in the layered compound. In this case, the cation may be any one selected between Fe and Al, and is preferably Fe.

The salt may be used in a sufficient amount to remove the alkaline earth metal ions contained in the layered compound, and is preferably included in an amount such that the layered compound-to-salt molar ratio in the mixed solution is in the range of 1:1 to 1:3. When the layered compound-to-salt molar ratio is greater than 1:1, the desired level of alkaline-earth-metal ion removal from the layered compound may not be achieved. On the other hand, when the layered compound-to-salt molar ratio is less than 1:3, the salt may not be dissolved in the mixed solution, which may further lead to problems such as sedimentation and the like.

There is no limitation on the solvent to be included in the mixed solution, and any conventional solvent capable of dissolving the salt may be used as the solvent. For example, the solvent may be hydrochloric acid.

Step (2) may be carried out at a temperature at which the alkali-metal ion removal reaction can take place smoothly. While the temperature may vary according to the composition of the mixed solution, Step (2) is preferably carried out at a temperature of no less than 20° C., and more preferably at a temperature of 20 to 60° C. When Step (2) is carried out at a temperature of less than 20° C., the desired level of alkali-metal ion removal may not be achieved, or the layered structure of the layered compound being prepared may be disrupted. Likewise, when Step (2) is carried out at a temperature of greater than 60° C., the layered structure of the layered compound being prepared may be disrupted. On the other hand, when Step (2) is carried out at a temperature of 20 to 60° C., a high level of alkali-metal ion removal can be achieved while the layered compound being prepared maintains the layered structure.

While Step (2) may be carried out multiple times depending on the composition of the mixed solution and the level of Li- and Ca-ion removal, it is preferable to perform Step (2) once so that the layered FeAs being prepared can maintain the layered structure.

Figure 4A:
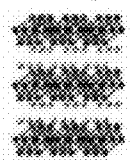
FIG. 4A shows scanning transmission electron microscope (STEM) images of the layered LiFeAs of Preparation Example 1 and the layered FeAs of Example 1.
Figure 4A:
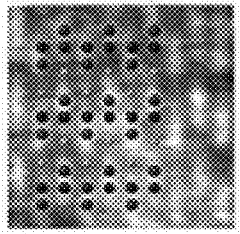
Figure 4A:
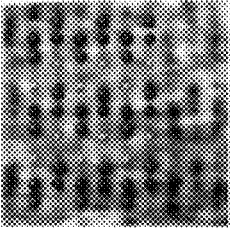
Figure 4A:
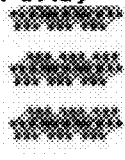
Figure 4A:
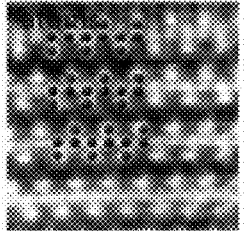
Figure 4A:
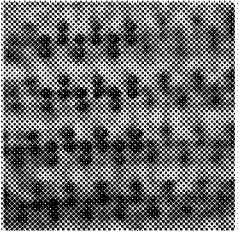
Figure 4B:
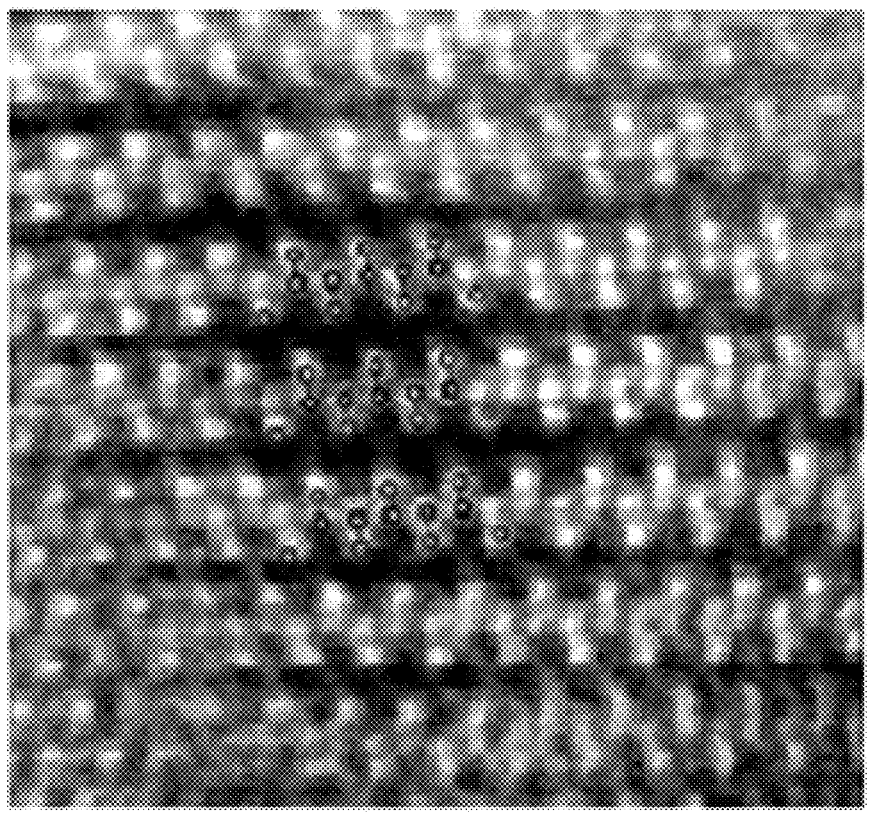
FIG. 4B shows a STEM image of a FeAs nanosheet of Example 5.

FIG. 4A confirms that only Li ions have been selectively removed without causing a change in the crystal structure of LiFeAs, and that FeAs has been synthesized without a change in the crystal structure of LiFeAs.

Hereinafter, the layered FeAs of the present invention will be described.

The layered FeAs of the present invention has a tetragonal crystal structure with the P4/nmm space group or the I4/mmm space group, which is unlike the crystal structure of the conventional 3D bulk FeAs. Therefore, the layered FeAs of the present invention has the ability to be easily exfoliated into nanosheets and exhibits different superconductivity from conventional 3D bulk FeAs.

According to one exemplary embodiment of the present invention, the layered FeAs having a tetragonal crystal structure with the P4/nmm space group may produce a peak at 2θ of 14.0±0.2 and not produce a peak at 2θ of 30.8±0.2, 34.2±0.2, 35.1±0.2, 36.5±0.2, 43.2±0.2, 44.0±0.2, 45.2±0.2, 45.9±0.2, 48.6±0.2, 53.2±0.2, 53.5±0.2, 55.4±0.2, 57.4±0.2, 59.9±0.2, 60.6±0.2, 64.5±0.2, 66.8±0.2, 74.2±0.2, 76.2±0.2, and 76.8±0.2 in an X-ray diffraction pattern obtained by a powder X-ray diffraction method using Cu-Kα radiation, as can be confirmed by the XRD analysis result of FeAs illustrated in FIG. 2C.

Figure 2D:
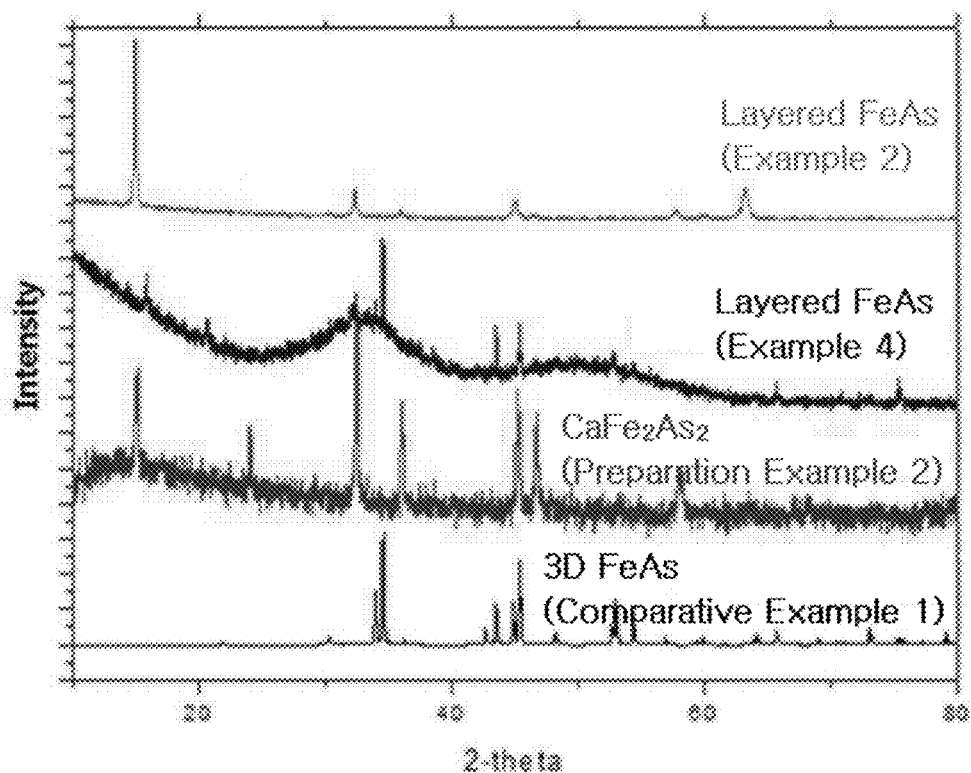
FIG. 2D is a graph illustrating XRD analysis results of the conventional 3D bulk FeAs, the $CaFe_2As_2$ of Preparation Example 2, and the layered FeAs of Example 2.

On the other hand, the layered FeAs having a tetragonal crystal structure with the I4/mmm space group may produce peaks at 2θ of 15.0±0.2, 32.3±0.2, 35.9±0.2, 45.0±0.2, 46.6±0.2, 57.8±0.2, 60.0±0.2, and 63.1±0.2 and not produce a peak at 2θ of 30.8±0.2, 34.2±0.2, 35.1±0.2, 36.5±0.2, 43.2±0.2, 44.0±0.2, 45.2±0.2, 45.9±0.2, 48.6±0.2, 53.2±0.2, 53.5±0.2, 55.4±0.2, 57.4±0.2, 59.9±0.2, 60.6±0.2, 64.5±0.2, 66.8±0.2, 74.2±0.2, 76.2±0.2, and 76.8±0.2, as can be confirmed by the XRD analysis result of FeAs illustrated in FIG. 2D.

Hereinafter, the FeAs nanosheet of the present invention will be described.

The FeAs nanosheet of the present invention may be obtained by the exfoliation of the layered FeAs of the present invention into nanosheets, and has a tetragonal crystal structure with the P4/nmm space group or the I4/mmm space group.

The exfoliation of the layered FeAs into nanosheets may be carried out by any known method of exfoliating a layered material in the art. For example, any one among exfoliation with energy generated by ultrasonic waves, exfoliation by solvent penetration, exfoliation with a tape, and exfoliation with a material having an adhesive surface may be used.

According to one exemplary embodiment of the present invention, the FeAs nanosheet may have a thickness of 60 nm or less. When the thickness exceeds 60 nm, the surface area of the FeAs nanosheet may be decreased, leading to degradation of superconductivity, or increased difficulty in stacking the FeAs nanosheet.

Meanwhile, the above-described layered FeAs and FeAs nanosheet of the present invention may be used as a superconducting material in a superconductor, for example, a superconducting cable.

Specifically, the superconducting cable may include: a core having a superconductor; and a cryostat used to maintain the core at a low cryogenic temperature. Here, the core may include at least one selected between the layered FeAs and FeAs nanosheet of the present invention. Since the cryostat of the present invention has a configuration known in the field of superconducting cables, a detailed description thereof will be omitted.

Although one exemplary embodiment of the present invention has been described above, it is to be understood that the scope of the present invention is not limited to the exemplary embodiment disclosed herein. Also, those skilled in the art who understand the spirit of the present invention will recognize that other embodiments may be easily suggested by adding, changing, deleting, or supplementing elements within the scope of the present invention, and it is to be understood that such other embodiments are also encompassed within the scope of the present invention.

EXAMPLES

Preparation Example 1

A predetermined amount of Fe powder, As powder, and Li powder was mixed with a sufficient amount of Sn powder, and the mixture was sealed in a quartz tube in an inert gas atmosphere. The quartz tube containing the sample was heat-treated for 12 hours at 750° C. Afterwards, the tube was slowly cooled at a cooling rate of 1° C./hr for LiFeAs recrystallization, and thereby a layered-LiFeAs single crystal having a tetragonal crystal structure with the P4/nmm space group was obtained.

Preparation Example 2

A predetermined amount of Fe powder, As powder, and Ca powder was mixed with a sufficient amount of Sn powder, and the mixture was sealed in a quartz tube in an inert gas atmosphere. The quartz tube containing the sample was heat-treated for 12 hours at 1050° C. Afterwards, the tube was slowly cooled at a cooling rate of 1° C./hr for $CaFe_2As_2$ recrystallization, and thereby a layered $CaFe_2As_2$ single crystal having a tetragonal crystal structure with the I4/mmm space group was obtained.

Preparation Example 3

The same procedure as in Preparation Example 1 was carried out, except that the heat treatment was performed at a temperature of 800° C., and thereby polycrystalline LiFeAs was obtained.

Preparation Example 4

The same procedure as in Preparation Example 2 was carried out, except that the heat treatment was performed at a temperature of 900° C., and thereby polycrystalline $CaFe_2As_2$ was obtained.

Example 1

The LiFeAs prepared in Preparation Example 1 was mixed with deionized water to remove Li ions therefrom, and thereby layered FeAs having a tetragonal crystal structure with the P4/nmm space group was obtained.

Example 2

The $CaFe_2As_2$ prepared in Preparation Example 2 was mixed with hydrochloric acid. The resultant solution was then saturated with a $FeCl_3$ salt to remove Ca ions from the $CaFe_2As_2$, and thereby layered FeAs having a tetragonal crystal structure with the I4/mmm space group was obtained.

Example 3

The polycrystalline LiFeAs prepared in Preparation Example 3 was mixed with deionized water to remove Li ions therefrom, and thereby layered FeAs was obtained.

Example 4

The polycrystalline $CaFe_2As_2$ prepared in Preparation Example 4 was mixed with hydrochloric acid. The resultant solution was then saturated with a $FeCl_3$ salt to remove Ca ions from the $CaFe_2As_2$, and thereby layered FeAs was obtained.

Example 5

The layered FeAs prepared in Example 1 was subjected to exfoliation with a Scotch™ pressure-sensitive adhesive tape (3M), and thereby a FeAs nanosheet was obtained.

Example 6

The layered FeAs prepared in Example 2 was subjected to exfoliation with a Scotch™ pressure-sensitive adhesive tape (3M), and thereby a FeAs nanosheet was obtained.

Comparative Example 1

A mixture of Fe powder and As powder was heat-treated for 96 hours at 800° C. and then cooled naturally, and thereby 3D bulk FeAs was obtained.

Comparative Example 2

The 3D bulk FeAs of Comparative Example 1 was subjected to exfoliation with a Scotch™ pressure-sensitive adhesive tape (3M), and thereby a FeAs nanosheet was obtained.

Experimental Example 1

XRD Analysis

The FeAs of Comparative Example 1 and the samples prepared according to Preparation Examples 1 to 4 and Examples 1 to 4 was analyzed by XRD, and the results are illustrated in FIGS. 2A to 2D.

FIG. 2A confirms that the LiFeAs of Preparation Example 1 has higher crystallinity than the LiFeAs of Preparation Example 3, and FIG. 2B confirms that the $CaFe_2As_2$ of Preparation Example 2 has higher crystallinity than the $CaFe_2As_2$ of Preparation Example 4.

FIG. 2C confirms that the LiFeAs (Preparation Example 1) having a layered structure was synthesized as a high-purity single crystal, and that the layered FeAs (Example 1), which was obtained by removing Li ions from the above-described layered LiFeAs, has a different crystal structure from that of the 3D bulk FeAs, as can be confirmed by the peak produced at $2\theta$ of $14.0\pm0.2$.

FIG. 2D confirms that the $CaFe_2As_2$ (Preparation Example 2) having a layered structure was synthesized as a high-purity single crystal, and that the layered FeAs (Example 2), which was obtained by removing Ca ions from the above-described layered $CaFe_2As_2$, has a different crystal structure from that of the 3D bulk FeAs, as can be confirmed by the peaks produced at $2\theta$ of $15.0\pm0.2$, $32.3\pm0.2$, $35.9\pm0.2$, $45.0\pm0.2$, $46.6\pm0.2$, $57.8\pm0.2$, $60.0\pm0.2$, and $63.1\pm0.2$. FIG. 2D also confirms that the layered FeAs (Example 4) obtained by performing the Ca-ion removal process has relatively low crystallinity.

Experimental Example 2

SEM Analysis

Figure 3A:
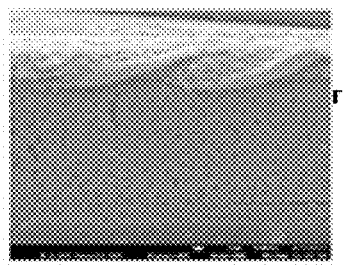
FIG. 3A shows scanning electron microscope (SEM) images of the layered LiFeAs of Preparation Example 1, the layered FeAs of Example 1, and a FeAs nanosheet of Example 5.
Figure 3A:
Figure 3A:
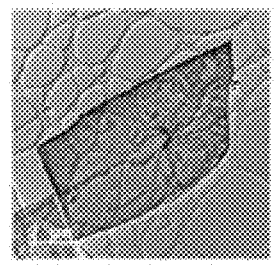
Figure 3B:
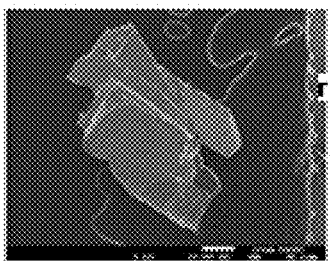
FIG. 3B shows SEM images of the layered LiFeAs of Preparation Example 2, the layered FeAs of Example 2, and a FeAs nanosheet of Example 6.
Figure 3B:
Figure 3B:
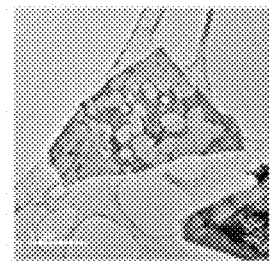

SEM images of the samples prepared according to Preparation Example 1, Preparation Example 2, and Examples 1 to 6 were taken, and the results are illustrated in FIGS. 3A and 3B.

FIGS. 3A and 3B confirm that the FeAs (Example 1 and Example 2) respectively obtained from the LiFeAs (Preparation Example 1) and the $CaFe_2As_2$ (Preparation Example 2) have a layered structure.

FIGS. 3A and 3B also confirm that the FeAs exfoliated from the layered FeAs is in the form of a nanosheet.

Experimental Example 3

STEM Analysis

The samples prepared according to Examples 1 and 2 were analyzed by STEM, and the results are illustrated in FIG. 4A.

FIG. 4A confirms that Li atoms were completely removed from LiFeAs, leaving only the tetrahedral layer of FeAs.

Experimental Example 4

AFM Analysis

Figure 5A:
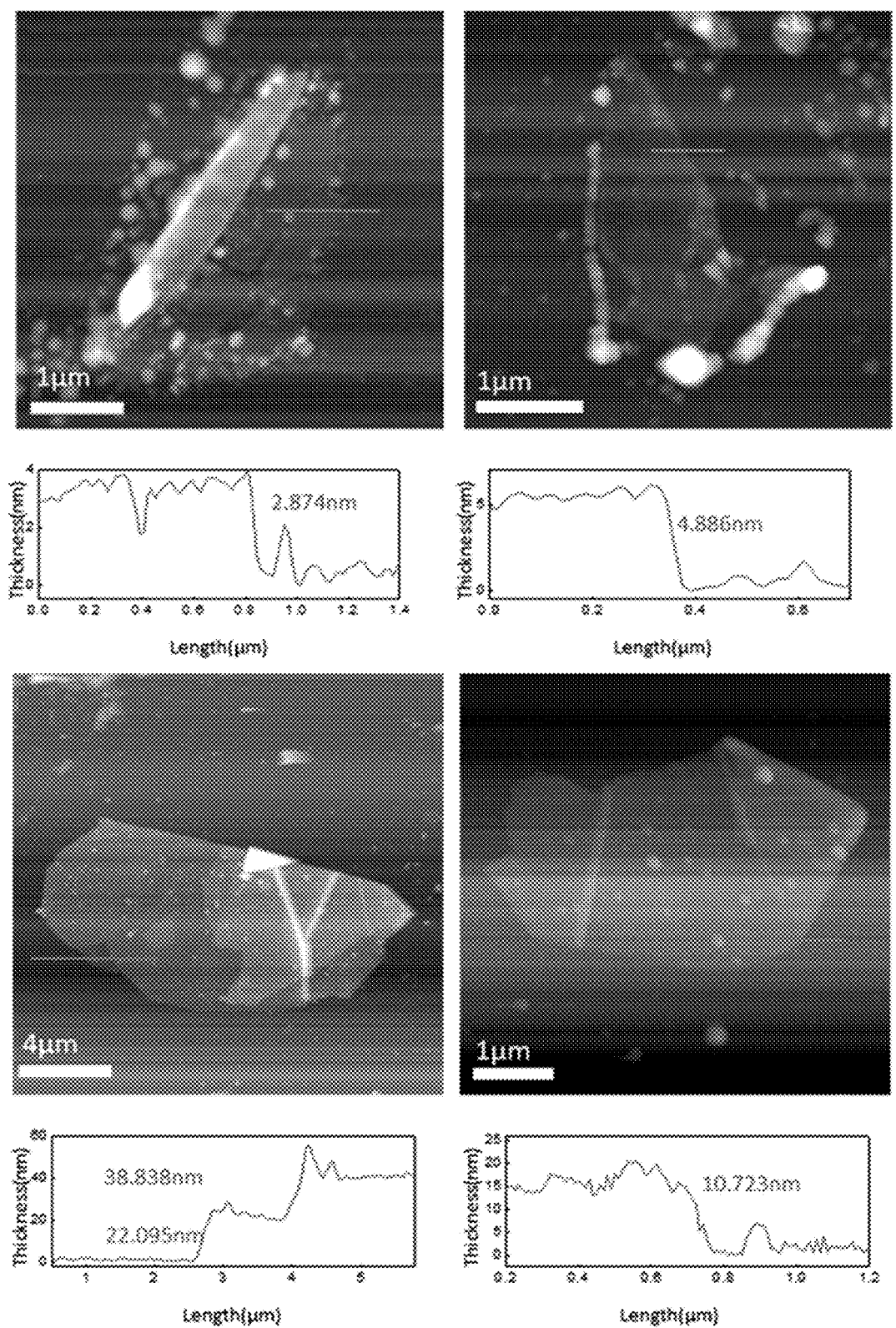
FIG. 5A shows photographs and atomic force microscope (AFM) images of FeAs nanosheets of Example 5.
Figure 5B:
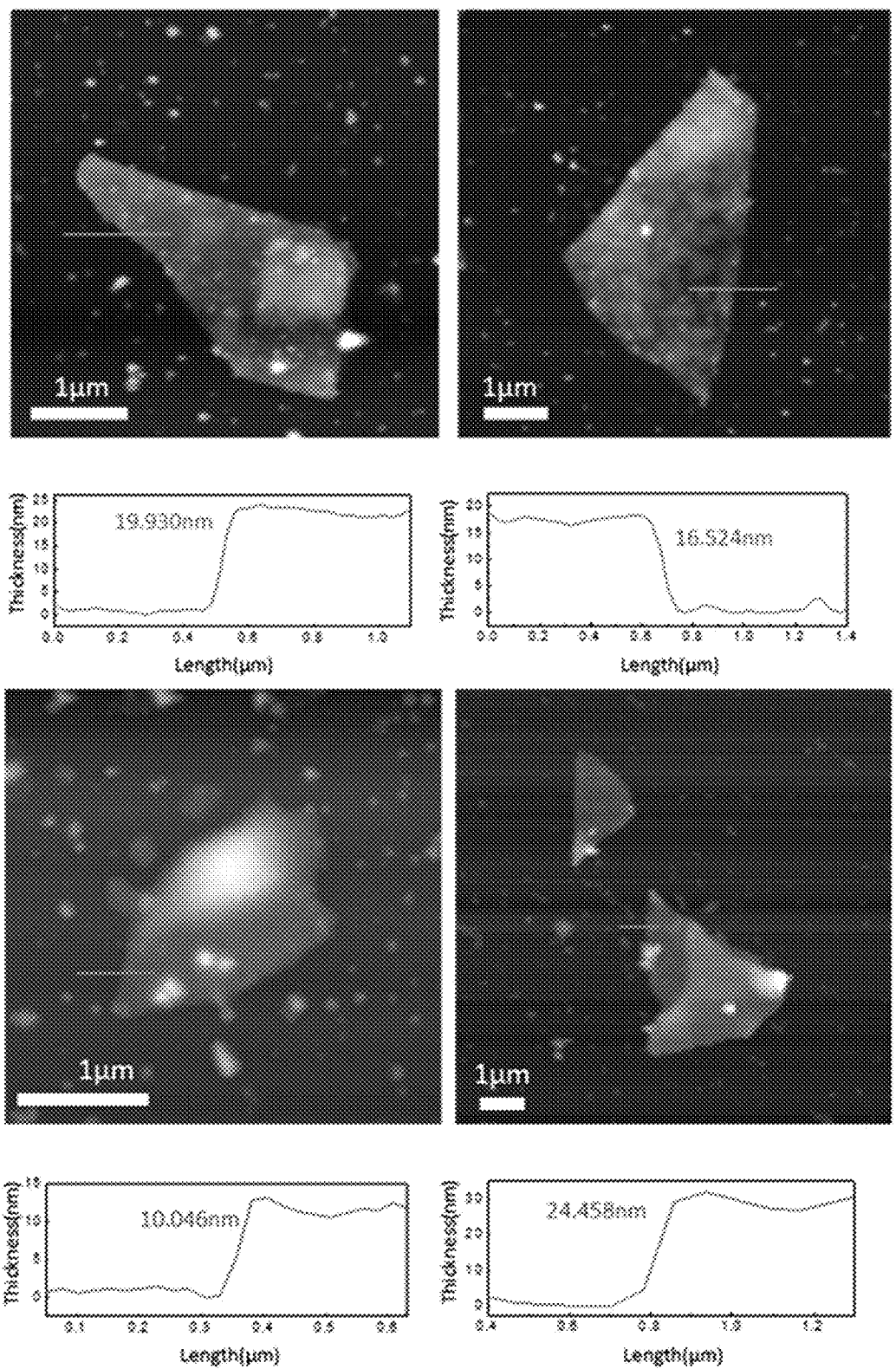
FIG. 5B shows photographs and AFM images of FeAs nanosheets of Example 6.

The FeAs nanosheets of Examples 5 and 6 were analyzed by AFM, and the results are illustrated in FIGS. 5A and 5B.

FIG. 5A shows that the exfoliation according to Example 5 resulted in the FeAs nanosheets having a thickness of 2.874 nm, 4.886 nm, 22.095 nm, 38.838 nm, and 10.723 nm, and FIG. 5B shows that the exfoliation according to Example 6 resulted in the FeAs nanosheets having a thickness of 19.930 nm, 16.524 nm, 10.046 nm, and 24.458 nm.

Experimental Example 5

PPMS Electrical Transport

Figure 6:
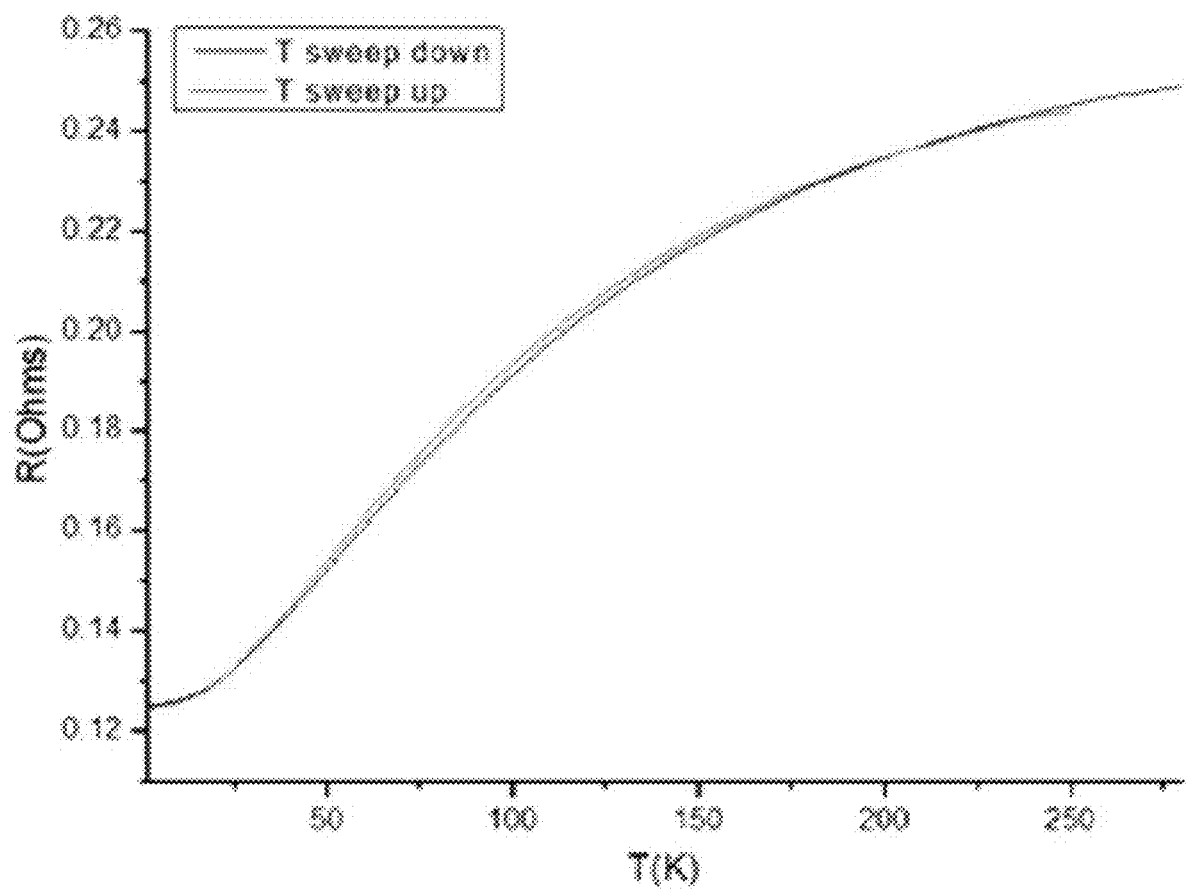
FIG. 6 is a graph illustrating the resistance of the layered FeAs of Example 1 as a function of temperature.

The electrical transport characteristics of the layered FeAs of Example 1 were measured, and the results are illustrated in FIG. 6. FIG. 6 confirms that the layered FeAs of Example 1 has a metallic characteristic, which is unlike the conventional 3D bulk FeAs.

Experimental Example 6

XPS Analysis

Figure 7C:
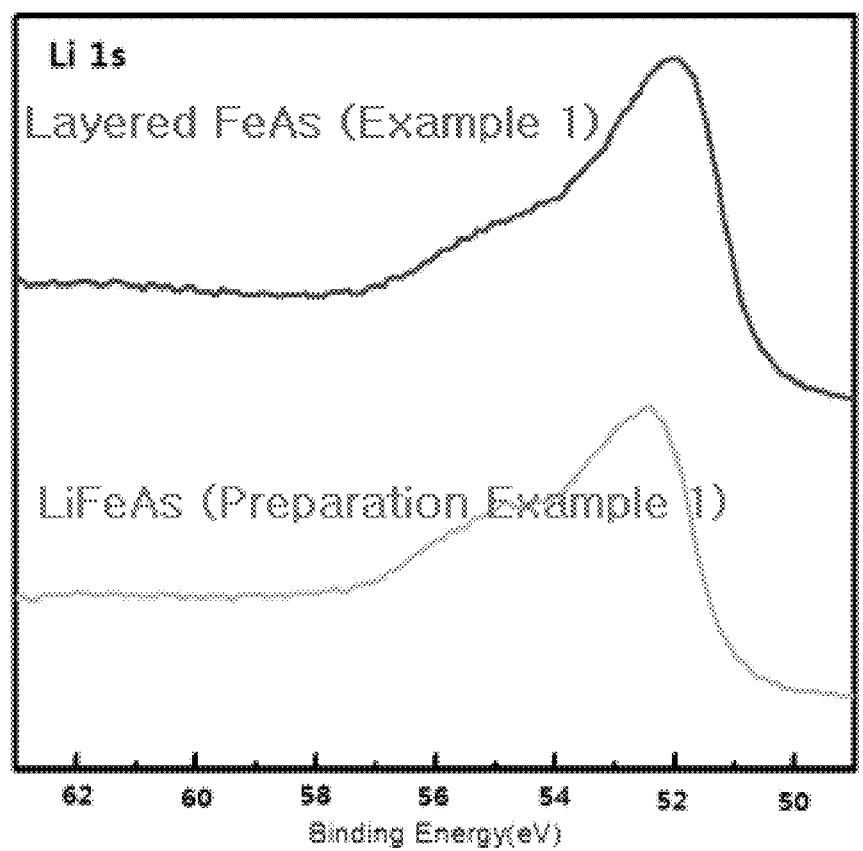
FIG. 7C is a graph illustrating XPS results of the LiFeAs of Preparation Example 1 and the layered FeAs of Example 1, which is shown for Li 1s.
Figure 8:
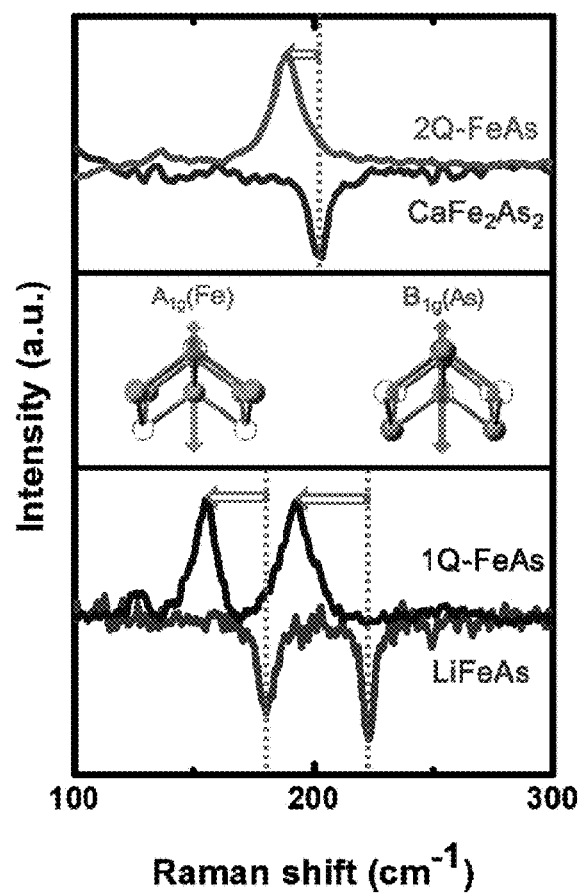
FIG. 8 is a graph showing Raman Shift after removing Li ion and Ca ion from LiFeAs and $CaFe_2As_2$ respectively, according to an exemplary embodiment of the present invention.
Figure 9:
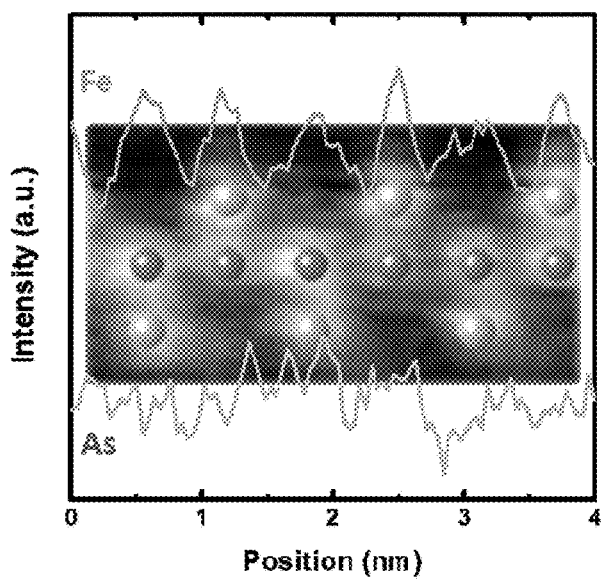
FIG. 9 is STEM EDS analysis result of the layered FeAs obtained from the LiFeAs according to an exemplary embodiment of the present invention.

The LiFeAs of Preparation Example 1, the 3D bulk FeAs of Comparative Example 1, and the layered FeAs of Examples 1 and Example 2 were analyzed by XPS, and the results are illustrated in FIGS. 7A to 7C.

FIGS. 7A and 7B show that the main spectra for Fe and As shifted toward the high binding energy, and it is determined that the shift was caused by the difference in Fe—As coordination number between the 3D FeAs and the layered FeAs.

Since, unlike conventional bulk FeAs, the layered FeAs of the present invention has a 2D crystal structure, has the ability to be easily exfoliated into nanosheets, and has excellent superconductivity, it can be widely used as a high-temperature superconductor.

What is claimed is:

1. A method of preparing layered FeAs, the method comprising:

step (1) of heat-treating a mixture including Li or Ca powder, Fe powder, and As powder and cooling the mixture, thereby obtaining a layered compound that has a tetragonal crystal structure with the P4/nmm space group and is represented by the chemical formula LiFeAs or has a tetragonal crystal structure with the I4/mmm space group and is represented by the chemical formula $CaFe_2As_2$; and step (2) of selectively removing Li ions or Ca ions contained in the layered compound without disrupting the crystal structure of the layered compound, thereby obtaining layered FeAs.

2. The method of claim 1, wherein the Li ions contained in the layered compound are removed by treatment of the layered compound with a solvent including at least one selected among water, ethanol, and isopropanol.

3. The method of claim 1, wherein the Ca ions contained in the layered compound are removed by treatment of the layered compound with a mixed solution containing a salt represented by the following Chemical Formula 1 and a solvent capable of dissolving the salt:

$$MX_a (1 \leq a \leq 3) \qquad \text{<Chemical Formula 1>}$$

wherein, in Chemical Formula 1, M is any one selected between Fe and Al, and X is any one selected among Cl, F, and I.

4. The method of claim 1, wherein the mixture includes Li powder, Fe powder, and As powder, and the heat treatment of the step (1) is carried out at 650 to 800° C. for 3 to 7 days.

5. The method of claim 1, wherein the mixture includes Ca powder, Fe powder, and As powder, and the heat treatment of the step (1) is carried out at 1000 to 1100° C. for 6 to 24 hours.

6. The method of claim 1, wherein the cooling of step (1) is carried out at a cooling rate of 0.5 to 3° C./hour.

* * * * *